(12) United States Patent
Tsutsumi et al.

(10) Patent No.: US 8,475,023 B2
(45) Date of Patent: Jul. 2, 2013

(54) LIGHT EMITTING MODULE AND AUTOMOTIVE LAMP

(75) Inventors: Yasuaki Tsutsumi, Shizuoka (JP); Masanobu Mizuno, Shizuoka (JP); Takaaki Komatsu, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 252 days.

(21) Appl. No.: 12/913,731

(22) Filed: Oct. 27, 2010

(65) Prior Publication Data

US 2011/0121731 A1    May 26, 2011

(30) Foreign Application Priority Data

Nov. 20, 2009   (JP) ................................. 2009-265246

(51) Int. Cl.
*F21V 11/00* (2006.01)
(52) U.S. Cl.
USPC .......................... 362/539; 362/545; 362/507
(58) Field of Classification Search
USPC .................. 362/509, 510, 525, 539, 543–545
See application file for complete search history.

(56) References Cited

U.S. PATENT DOCUMENTS

| | | | |
|---|---|---|---|
| 7,300,191 B2 * | 11/2007 | Oshio et al. | 362/545 |
| 7,654,712 B2 | 2/2010 | Takeda et al. | |
| 7,922,355 B1 * | 4/2011 | Morejon et al. | 362/247 |
| 2006/0197098 A1 | 9/2006 | Aihara | |

FOREIGN PATENT DOCUMENTS

| | | |
|---|---|---|
| CN | 1756923 A | 4/2006 |
| JP | 2001-266620 | 9/2001 |
| JP | 2003-503253 A1 | 1/2003 |
| JP | 2003-045210 | 2/2003 |
| JP | 2008010228 A * | 1/2008 |

OTHER PUBLICATIONS

English Translation of JP2008-010228, published Jan. 17, 2008.*
WO01/01038, Applicant: Koninklijke Philips Electronics N.V., published Jan. 4, 2001, bibliographical page including English abstract corresponding to JP2003-503253.
Chinese Office Action, Jul. 10, 2012, 7 pages.
SIPO, Office Action in counterpart Chinese Application No. 201010524673.9 dated Feb., 17, 2013 with translation.

* cited by examiner

Primary Examiner — Mary Ellen Bowman
(74) Attorney, Agent, or Firm — Fulwider Patton LLP (57) ABSTRACT

A light emitting module includes: a plurality of semiconductor light emitting elements; a substrate by which the arranged plurality of semiconductor light emitting elements are supported; and a plate-shaped light wavelength conversion component that is provided so as to face the light emitting surfaces of the plurality of semiconductor light emitting elements and that converts the wavelength of the light emitted by the semiconductor light emitting element. A phosphor layer has a shielding portion formed in the boundary between respective areas facing the respective light emitting surfaces of the adjacent semiconductor light emitting elements.

7 Claims, 9 Drawing Sheets

LIGHT EMITTING MODULE AND AUTOMOTIVE LAMP

CROSS-REFERENCE TO RELATED APPLICATION

This application is based upon and claims the benefit of priority from the prior Japanese Patent Application No. 2009-265246, filed on Nov. 20, 2009, the entire contents of which are incorporated herein by reference.

BACKGROUND OF THE INVENTION

1. Field of the Invention

The present invention relates to a light emitting module comprising a light emitting element.

2. Description of the Related Art

Conventionally, automotive lighting devices have been known in which many semiconductor light sources are arranged in a matrix pattern such that any light distribution can be achieved by selectively turning on the semiconductor light sources at specific sites.

In such a lighting device, however, when part of the semiconductor light sources are turned off in order to achieve a desired light distribution, there is the possibility that the light emitted by the semiconductor light source, which is being turned on adjacent to the semiconductor light source that has been turned off, may enter the area to which light is not originally to be emitted corresponding to the turned-off semiconductor light source. Accordingly, the light entering the area becomes glare for a target present in the area to which light is not originally to be emitted.

SUMMARY OF THE INVENTION

The present invention has been made in view of these situations, and a purpose of the invention is to provide a technique in which a desired light distribution characteristic is achieved with high accuracy.

In order to solve the aforementioned problem, a light emitting module according to an embodiment of the present invention comprises: a plurality of semiconductor light emitting elements; a substrate by which the arranged plurality of semiconductor light emitting elements are supported; and a plate-shaped light wavelength conversion component that is provided so as to face the light emitting surfaces of the plurality of semiconductor light emitting elements and that converts the wavelength of the light emitted by the semiconductor light emitting element. The light wavelength conversion component has a shielding portion formed in the boundary between respective areas facing the respective light emitting surfaces of the adjacent semiconductor light emitting elements.

According to the embodiment, even if part of the light emitted by at least one of the semiconductor light emitting elements is emitted toward the light wavelength conversion component located in an area facing the light emitting surface of the adjacent semiconductor light emitting element, the light can be shielded by the shielding portion. Accordingly, it can be suppressed that the light wavelength conversion component in the area facing the light emitting surface of the adjacent semiconductor light emitting element may be illuminated by the light emitted from at least one of the semiconductor light emitting elements.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

The present invention will now be described in detail based on preferred embodiments for carrying out the invention with reference to the accompanying drawings. The same constituents illustrated in each drawing will be denoted with the same reference numeral, and the duplicative descriptions thereof are appropriately omitted.

An automotive headlamp apparatus according to the present embodiment comprises: a lamp unit configured to emit light by which part of the area of a light distribution pattern for high beam can be formed; and an illumination controller configured to control an illumination state of the light emitted by the lamp unit. The illumination controller controls the illumination state of the light such that the part of the area of the light distribution pattern for high beam is formed by partial areas divided, at least in the vehicle width direction, into multiple pieces. Light intensity distributions suitable for an illumination mode for high beam and that for daytime lighting are formed by individually adjusting the light intensity of the emitted light corresponding to each partial area such that the aforementioned two illumination modes are switched to each other.

Figure 1:
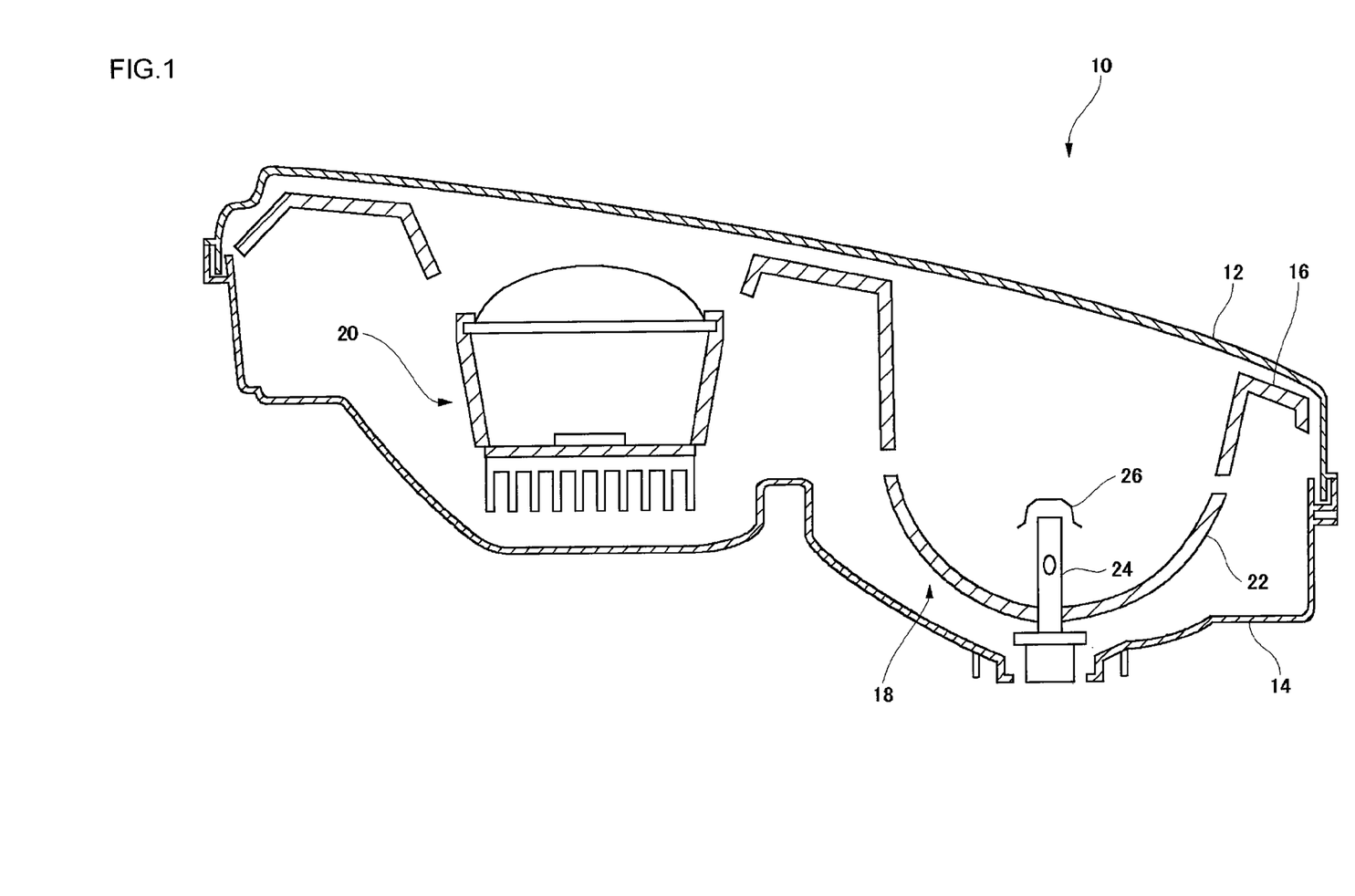
FIG. 1 is a schematic view illustrating the structure of a lamp body unit of which an automotive headlamp apparatus according to the present embodiment is composed.

FIG. 1 is a schematic view illustrating the structure of a lamp body unit of which an automotive headlamp apparatus according to the present embodiment is composed. The automotive headlamp apparatus according to the present embodiment includes a pair of lamp body units located at the right and left ends in the vehicle width direction of the front portion of a vehicle. By superimposing the light distribution patterns emitted from the right and left lamp body units one on another in front of the vehicle, the illumination as an automotive head lamp apparatus is completed. Of the right and left lamp body units, FIG. 1 illustrates the structure of a lamp body unit 10 arranged on the right side. For easy understanding, FIG. 1 illustrates a cross-sectional view of the lamp body unit 10 that has been cut by a horizontal plane, when viewed from the top. The lamp body unit arranged on the left side has the structure symmetrical with that of the lamp body unit 10 arranged on the right side, and the basic structures of the two are the same as each other. Accordingly, only the lamp body unit 10 arranged on the right side will be described and the description with respect to that arranged on the left side will be omitted. Hereinafter, for convenience, the description will be sometimes made assuming that the direction where the light of the lamp is emitted is the vehicle's front (front side) and the opposite direction is the vehicle's back (back side).

The lamp body unit 10 has a translucent cover 12, a lamp body 14, an extension 16, a first lamp unit 18, and a second lamp unit 20. The lamp body 14 is formed of a resin, etc., so as to have a cup-shape with a long and thin opening. The translucent cover 12 is formed of a resin, etc., having translucency, and is fixed to the lamp body 14 so as to cover the opening of the lamp body 14. In this way, a lamp chamber that is a substantial closed space is formed by the lamp body 14 and the translucent cover 12, and in the lamp chamber, the extension 16, the first lamp unit 18, and the second lamp unit 20 are arranged.

The extension 16 has an opening for passing the light emitted from the first and the second lamp units 18 and 20, and is fixed to the lamp body 14. The first lamp unit 18 is arranged, in the vehicle width direction, more outside than the second lamp unit 20. The first lamp unit 18 is a so-called parabola-type lamp unit and forms a light distribution pattern for low beam, which will be described later.

The first lamp unit 18 has a reflector 22, a light source bulb 24, and a shade 26. The reflector 22 is formed into a cup-shape and is provided with an insertion hole at its center. In the present embodiment, the light source bulb 24 is composed of an incandescent lamp having a filament, such as a halogen lamp. As the light source bulb 24, a light source of another type, such as a discharge lamp, etc., may be adopted. The light source bulb 24 is fixed to the reflector 22 by being inserted through the insertion hole of the reflector 22 so as to protrude inside. A curved surface is formed on the inner surface of the reflector 22 such that the light emitted by the light source bulb 24 is reflected toward the front of the vehicle. The shade 26 shields the light directly travelling from the light source bulb 24 to the front of the vehicle. Because the structure of the first lamp unit 18 is known, detailed description with respect thereto will be omitted.

Figure 2:
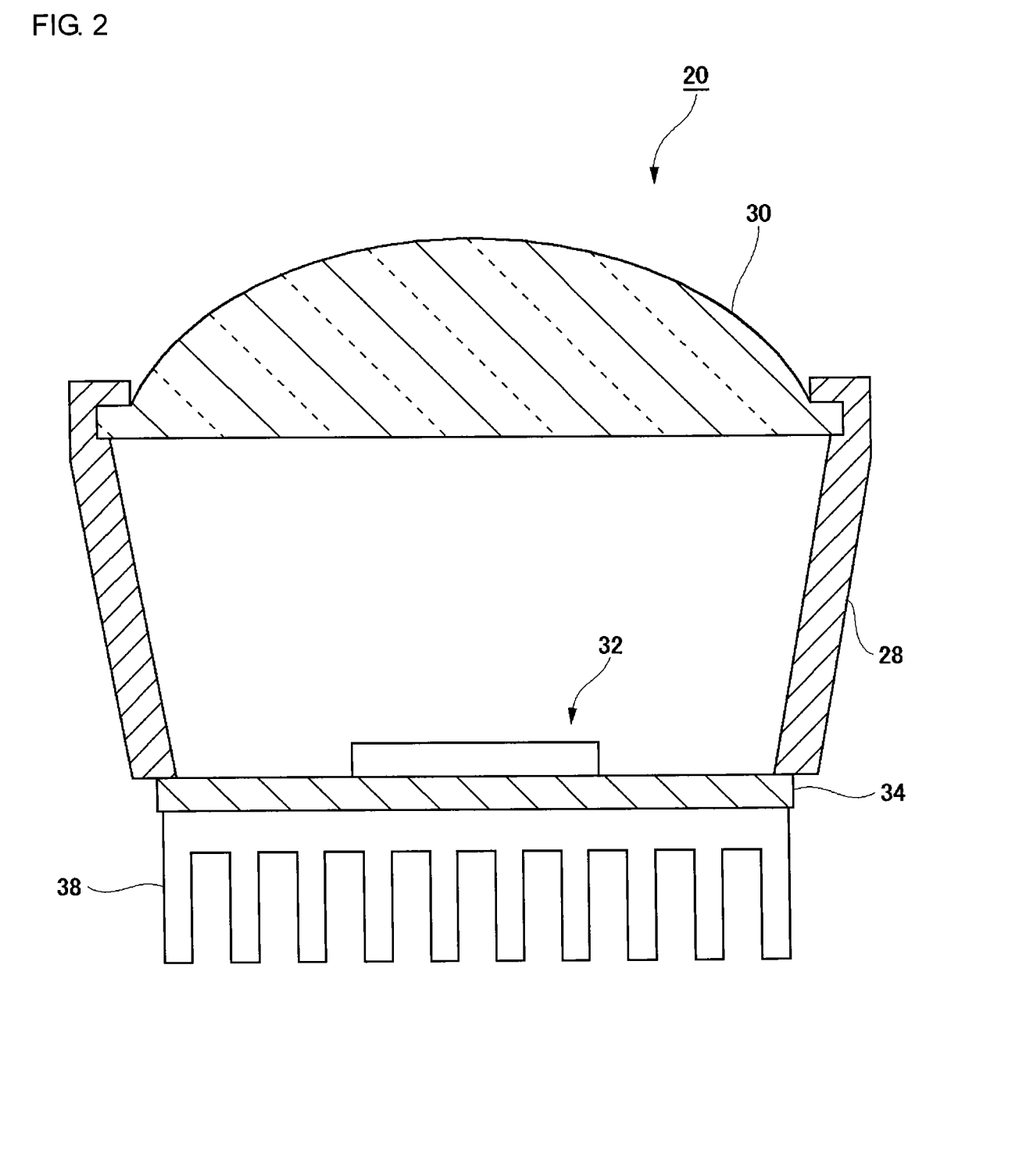
FIG. 2 is a view illustrating the structure of a second lamp unit included in the lamp body unit according to the present embodiment.

FIG. 2 is a view illustrating the structure of the second lamp unit 20 included in the lamp body unit 10 according to the present embodiment. FIG. 2 illustrates a cross-sectional view of the second lamp unit 20 that has been cut by a horizontal plane, when viewed from the top. The second lamp unit 20 comprises a holder 28, a projection lens 30, a light emitting module 32, and a heat sink 38. The second lamp unit 20 is one emitting the light capable of forming all or part of the area of a light distribution pattern for high beam. That is, the second lamp unit 20 forms a light distribution pattern for high beam in the upper part of a light distribution pattern for low beam formed by the first lamp unit 18 during an illumination mode for high beam. By adding the light distribution pattern for high beam to that for low beam, the illumination area is widened as a whole, and the distant visibility is also improved. The second lamp unit 20 functions as an illumination lamp for daytime lighting, a so-called daytime running lamp (DRL), in which the driver' vehicle can be easily recognized by an oncoming vehicle or a pedestrian, etc., in the daytime or the like by separately emitting light during the illumination mode for daytime lighting.

The projection lens 30 is composed of a plano-convex aspheric lens, the front surface of which is convex-shaped and the back surface of which is flat-shaped, and the projection lens 30 projects, as an inverted image, the image of the light source that is formed on the back focal plane onto a virtual vertical screen in front of the lamp. The projection lens 30 is fixed to an opening on one side of the holder 28 formed to be tubular-shaped.

First Embodiment

Figure 3:
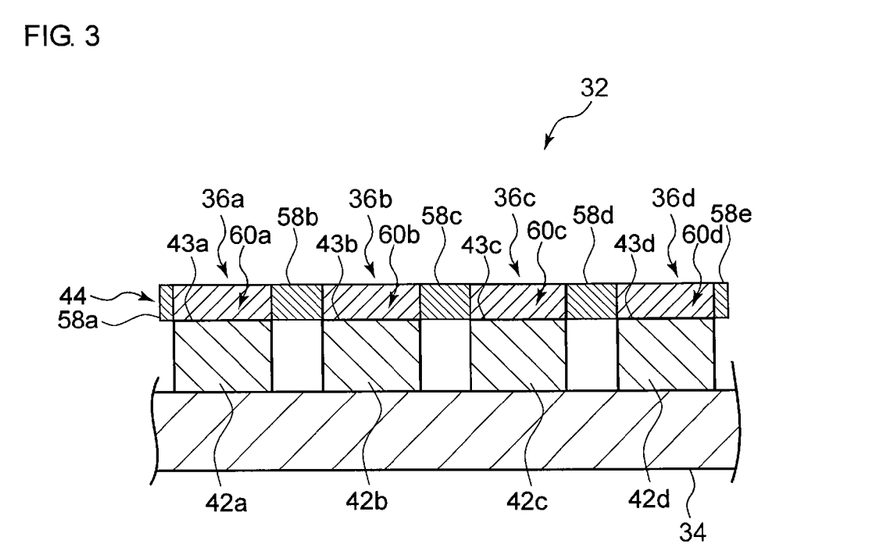
FIG. 3 is a cross-sectional view illustrating the major portion of a light emitting module according to a first embodiment.

FIG. 3 is a cross-sectional view illustrating the major portion of a light emitting module according to a first embodiment. The light emitting module 32 has a first light emitting unit 36a, a second light emitting unit 36b, a third light emitting unit 36c, a fourth light emitting units 36d, and a substrate 34 by which the first through the fourth light emitting units 36a to 36d are supported. When each of the light emitting units 36a to 36d is not particularly distinguished from each other, they will be collectively denoted with a light emitting unit 36. The substrate 34 according to the present embodiment is a printed circuit board.

The light emitting module 32 emits the light for a light distribution pattern for high beam and is configured to selectively illuminate part of a plurality of areas, which are divided into multiple pieces in the vehicle width direction. In the present embodiment, a light distribution pattern for high beam is formed by combining the respective illumination areas, which are divided in accordance with the first through the fourth light emitting units 36a to 36d. The number of the division can be determined in accordance with the performance needed in the illumination mode for high beam and that for daytime lighting. For example, the number of the divided areas may be more or less than 4 as long as the number is plural, or the number may be even or odd.

Each of the first through the fourth light emitting units 36a to 36d is formed to be rectangular-shaped and is arranged in a straight line on the substrate 34 so as to be band-shaped in the order of the first through the fourth light emitting units 36a to 36d. The first through the fourth light emitting units 36a to 36d can be formed of, for example, light sources, each of which can be individually controlled in light intensity. That is, the second lamp unit 20 is a multi-lamp light source.

Light sources of which the first through the fourth light emitting units 36a to 36d are composed comprise semiconductor light emitting elements, for example, LED elements, etc., having square-shaped light emitting surfaces, each side of which is approximately 1 mm long. It is needless to say that the light sources in the light emitting unit 36 are not limited thereto, and another element-type light source that surface-emits light in an approximately point-like shape, such as a laser diode, may be adopted.

The heat sink 38, formed into a shape having many fins by a metal such as aluminum, is fixed to the back surface of the substrate 34. By structuring the first through the fourth light emitting units 36a to 36d with LED light sources in this way, an illumination state of each light emitting unit 36 can be accurately adjusted. As a result, a desired light distribution characteristic can be achieved with high accuracy in an illumination mode for high beam and that for daytime lighting, which will be described later.

The substrate 34 is fixed to the opening on the other side of the holder 28 such that the light emitting module 32, in which the first through the fourth light emitting units 36a to 36d are lined up in this order from left to right, is arranged inside the holder 28. When each of the first through the fourth light emitting units 36a to 36d emits light, each image thereof will be projected on a virtual vertical screen in front of the lamp.

Figure 4:
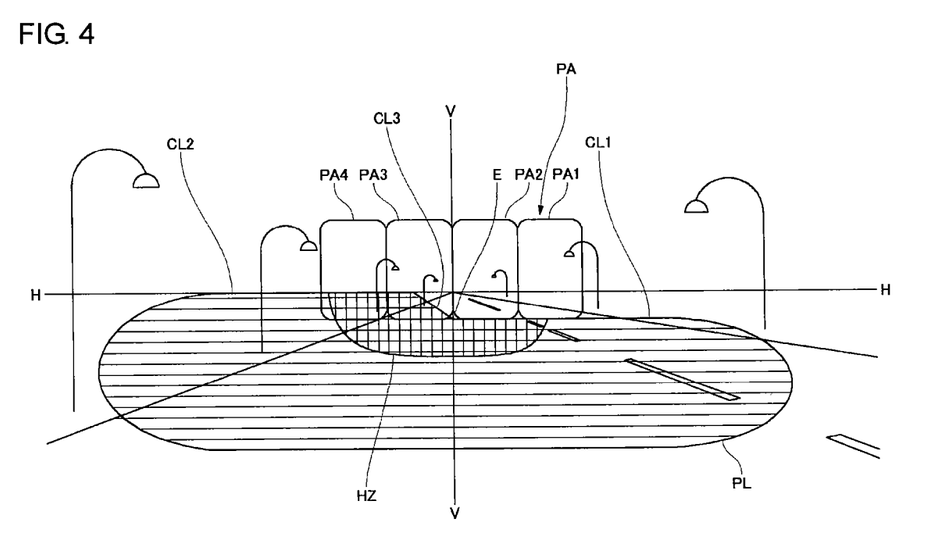
FIG. 4 is a view illustrating a light distribution pattern formed on a virtual vertical screen arranged at, for example, a 25-meter position in front of a vehicle, by the light emitted forward by the right and left lamp body units in the automotive headlamp apparatus according to the present embodiment.

FIG. 4 is a view illustrating a light distribution pattern formed on a virtual vertical screen arranged at, for example, a 25-meter position in front of a vehicle, by the light emitted forward by the right and left lamp body units 10 in the automotive lamp apparatus according to the present embodiment.

A light distribution pattern for low beam PL is formed by the first lamp unit 18. The light distribution pattern for low beam PL is a left-distributed pattern for low beam used in areas of left-hand traffic, and has a first through a third cut-off lines CL1 to CL3 at the upper end edge thereof. The first and the third cutoff lines CL1 and CL3 extend horizontally at different levels on right and left sides between the vertical line V-V set in the front direction of the lamp. The first cutoff line CL1 extends horizontally in the lower part below the horizontal line H-H set on the right side of the vertical line V-V and in the front direction of the lamp. Accordingly, the first cutoff line CL1 is used as a cutoff line for the opposite lane.

The third cutoff line CL3 extends obliquely toward the left upside from the left end of the first cutoff line CL1, for example, at a tilt angle of 45°. The second cutoff line CL2 extends on the horizontal line H-H on the left side of the intersection between the third cutoff line CL3 and the horizontal line H-H. Accordingly, the second cutoff line CL2 is used as a cutoff line for the driver's vehicle lane side. In the light distribution pattern for low beam PL, an elbow point E at the intersection between the first cutoff line CL1 and the vertical line V-V is located below the intersection H-V by approximately 0.5 to 0.6°. A hot zone HZ, an area illuminated with a high light intensity, is formed by adjusting the shape of the reflector 22 so as to enclose the elbow point E at a slight left side position, thereby enhancing the visibility for the driver's vehicle lane side.

An additional light distribution pattern PA, part of the area of a light distribution pattern for high beam, is formed by the light emitted from the second lamp unit 20. The additional light distribution pattern PA is formed into a band-shape extending horizontally including the vertical line H-H.

The additional light distribution pattern PA is structured by being divided into four rectangular areas lined up horizontally, in accordance with the number of the light emitting units 36. Hereinafter, these areas are referred to as a first through a fourth partial areas PA1 to PA4 in sequence from right to left, and a boundary line between adjacent partial areas is referred to as a division line. The division line between the second and third partial areas PA2 and PA3 is set to be 0°, which corresponds to the vertical line V-V.

The first partial area PA1 is formed by the light emitted from the first light emitting unit 36a. The second partial area PA2 is formed by the light emitted from the second light emitting unit 36b. The third partial area PA3 is formed by the light emitted from the third light emitting unit 36c. The fourth partial area PA4 is formed by the light emitted from the fourth light emitting unit 36d.

Although detailed description will be made later, turn on/off or dimming of the first through the fourth light emitting units 36a to 36d can be performed individually or for each of grouped multiple units, based on an operation of the driver or the information from devices mounted on a vehicle to detect a forward vehicle, such as a oncoming vehicle or a leading vehicle, or a pedestrian. Thereby, a plurality of light distribution patterns each having an illumination area different from each other can be obtained. Accordingly, glare to be provided to a forward vehicle or a pedestrian can be prevented by turning off the light emitting unit 36 that will illuminate an area where the forward vehicle or the pedestrian is present, of the first through the fourth partial areas PA1 to PA4.

For example, when an oncoming vehicle travelling in the opposite lane to the driver's vehicle lane is present, it can be made not to provide glare to the driver of the oncoming vehicle by turning off the first and the second light emitting units 36a and 36b. When a leading vehicle travelling in the same lane as the driver's vehicle is present, it can be made not to provide glare to the driver of the leading vehicle by turning off the second and the third light emitting units 36b and 36c. When a pedestrian walking on a roadside is present, it can be made not to provide glare to the pedestrian by turning off the first and the fourth light emitting units 36a and 36d. As stated above, remote visibility of a driver can be secured by turning off part of the plurality of light emitting units 36 not to make an oncoming vehicle, a leading vehicle, or a pedestrian, etc., feel glare, and by turning on the remaining light emitting units 36.

When combining the areas that the plurality of light emitting units 36 respectively illuminate to form a light distribution pattern, it is desirable that there is no gap (non-illumination area) between the respective areas. From such a point of view, the light emitting module 32 is configured such that the boundary areas of the illumination areas of the respective light emitting units 36 are superimposed one on another. On the other hand, if the superimposed area of the respective illumination areas is large, the light emitted from the turned-on light emitting unit 36a may enter the illumination area of the turned-off light emitting unit when some of the light emitting units 36 are turned off and the remaining light emitting units 36 are turned on, thereby providing glare to a vehicle-in-front or a pedestrian that is present in the superimposed area.

As a result of intensive study, the present inventors have reached the thought that the light emitted by a turned-on light emitting unit will be shielded by providing a shielding portion in a light wavelength conversion component, such as a phosphor layer, etc. Thereby, even if the adjacent light emitting unit is turned off, the glare that may be provided to a vehicle-in-front or a pedestrian present in the partial area corresponding to the turned-off light emitting unit, can be suppressed.

As illustrated in FIG. 3, the light emitting module 32 according to the present embodiment comprises the first through the fourth light emitting units 36a to 36d. The first light emitting unit 36a includes a semiconductor light emitting element 42a. The second light emitting unit 36b includes a semiconductor light emitting element 42b. The third light emitting unit 36c includes a semiconductor light emitting element 42c. The fourth light emitting unit 36d includes a semiconductor light emitting element 42d. A phosphor layer 44 is provided so as to face light emitting surfaces 43a to 43d of the respective semiconductor light emitting elements 42a to 42d. The phosphor layer 44 functions as a light wavelength conversion component that converts and emits the wavelength of the light emitted by each of the semiconductor light emitting elements 42a to 42d facing the phosphor layer 44.

The phosphor layer 44 has shielding portions 58a to 58e. The shielding portion 58b is formed in the boundary between the areas 60a and 60b respectively facing the light emitting surfaces 43a and 43b of the adjacent semiconductor light emitting elements 42a and 42b. The shielding portion 58c is formed in the boundary between the areas 60b and 60c respectively facing the light emitting surfaces 43b and 43c of the adjacent semiconductor light emitting elements 42b and 42c. The shielding portion 58d is formed in the boundary between the areas 60c and 60d respectively facing the light emitting surfaces 43c and 43d of the adjacent semiconductor light emitting elements 42c and 42d.

Accordingly, even if part of the light of the semiconductor light emitting element 42a is emitted toward the phosphor layer 44 in the area 60b facing the light emitting surface 43b of the adjacent semiconductor light emitting element 42b, the part of the light thereof will be shielded by the shielding portion 58b. Even if part of the light of the semiconductor light emitting element 42b is emitted toward the phosphor layer 44 in the areas respectively facing the light emitting surfaces 43a and 43c of the adjacent semiconductor light emitting elements 42a and 42c, the part of the light thereof will be shielded by the shielding portions 58b and 58c. Even if part of the light of the semiconductor light emitting element 42c is emitted toward the phosphor layer 44 in the areas respectively facing the light emitting surfaces 43b and 43d of the adjacent semiconductor light emitting elements 42b and 42d, the part of the light thereof will be shielded by the shielding portions 58c and 58d. Even if part of the light of the semiconductor light emitting element 42d is emitted toward the phosphor layer 44 in the area 60c facing the light emitting surface 43c of the adjacent semiconductor light emitting element 42c, the part of the light thereof will be shielded by the shielding portion 58c.

As stated above, in the light emitting module 32 according to the present embodiment, it can be suppressed that the phosphor layer 44 in an area facing the light emitting surface of the adjacent semiconductor light emitting element is illuminated by the light emitted from at least one of the semiconductor light emitting elements. As a result, for example, when the light emitting unit 36a is turned on and the light emitting unit 36b adjacent to the light emitting unit 36a is turned off, it can be suppressed that an area to be illuminated by the light emitting unit 36b is illuminated unintentionally. Further, even if part of the light of at least one of the semiconductor light emitting elements is emitted toward the illumination area of the adjacent semiconductor light emitting element, the part of the light thereof is shielded by the shielding portion provided in the phosphor layer 44. Accordingly, when the semiconductor light emitting element adjacent to a turned-on semiconductor light emitting element is turned off, it can be suppressed that the area to be illuminated by the light emitting unit provided with the turned-off semiconductor light emitting element may be illuminated unintentionally.

The phosphor layer 44 according to the present embodiment is provided with the shielding portions 58a and 58e in its outermost portion. Thereby, it can be suppressed that the areas in the right and left outsides of the light distribution pattern PA illustrated in FIG. 4 may be illuminated unintentionally.

A material to be injected into the shielding portion and the structure of the shielding portion only have to prevent at least the light incident into the shielding portion from transmitting through as it is. A material to be injected into the shielding portion is preferred to have a lower light transmission rate than that of at least the phosphor layer 44, and is appropriately selected from various opaque materials, for example, a resin composition, metal, and dielectric material, etc. The opaque material only has to absorb at least the wavelength of the light emitted by the semiconductor light emitting element without having to absorb light across the whole wavelength range of an electromagnetic wave. For example, the opaque material may selectively shield the ultraviolet light or the blue light emitted by the semiconductor light emitting element.

Alternatively, the shielding portion may function as a reflecting member. Such reflecting members include, for example, a resin composition, a metal, and a dielectric material, etc., all of which have a high reflectance. Further, in the shielding portion, a metal layer or a dielectric thin film may be formed on the boundary surface with the phosphor layer. For example, it is good to provide a reflective layer in the shielding portion by alternately overlapping a dielectric thin film with a high refractive index and that with a low refractive index to obtain multiple layers. In addition, it may also be good to reflect the light on the surface of the shielding portion by using a difference between the refractive indexes of the phosphor layer and the shielding portion. In this case, it is good to make the refractive index of the material to be injected into the shielding portion lower than that of the material of which the phosphor layer is composed. In addition, the shape of the shielding portion should not be limited to a polygonal shape, the cross-section of which is square-shaped as illustrated in FIG. 3, but the shielding portion may have a thin shape as a shielding layer. Alternatively, the shielding portion may be formed to penetrate the phosphor layer.

The shielding portions 58a and 58e, and those 58b, 58c, and 58d, illustrated in FIG. 3, may or may not be formed of the same material as each other.

Figure 5:
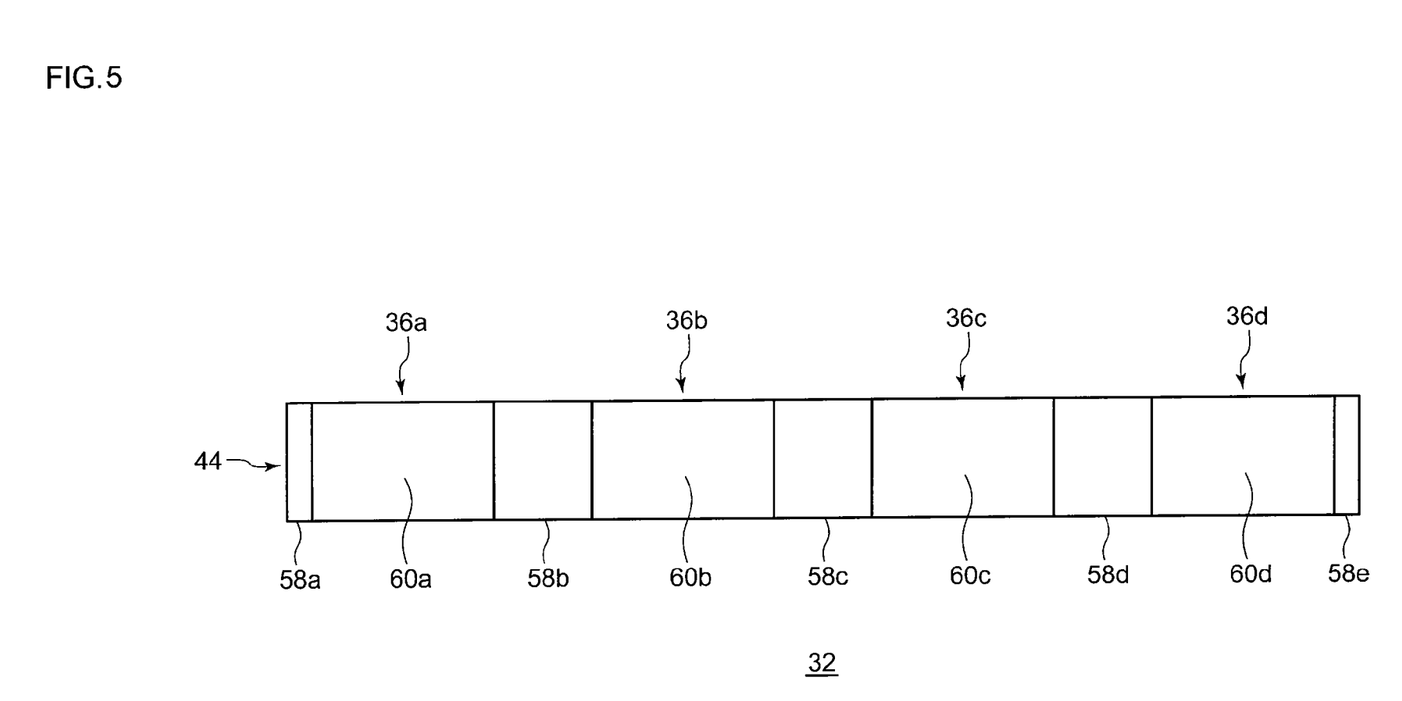
FIG. 5 is a view of the light emitting module according to the present embodiment, when viewed from the light emission side.
Figure 6:
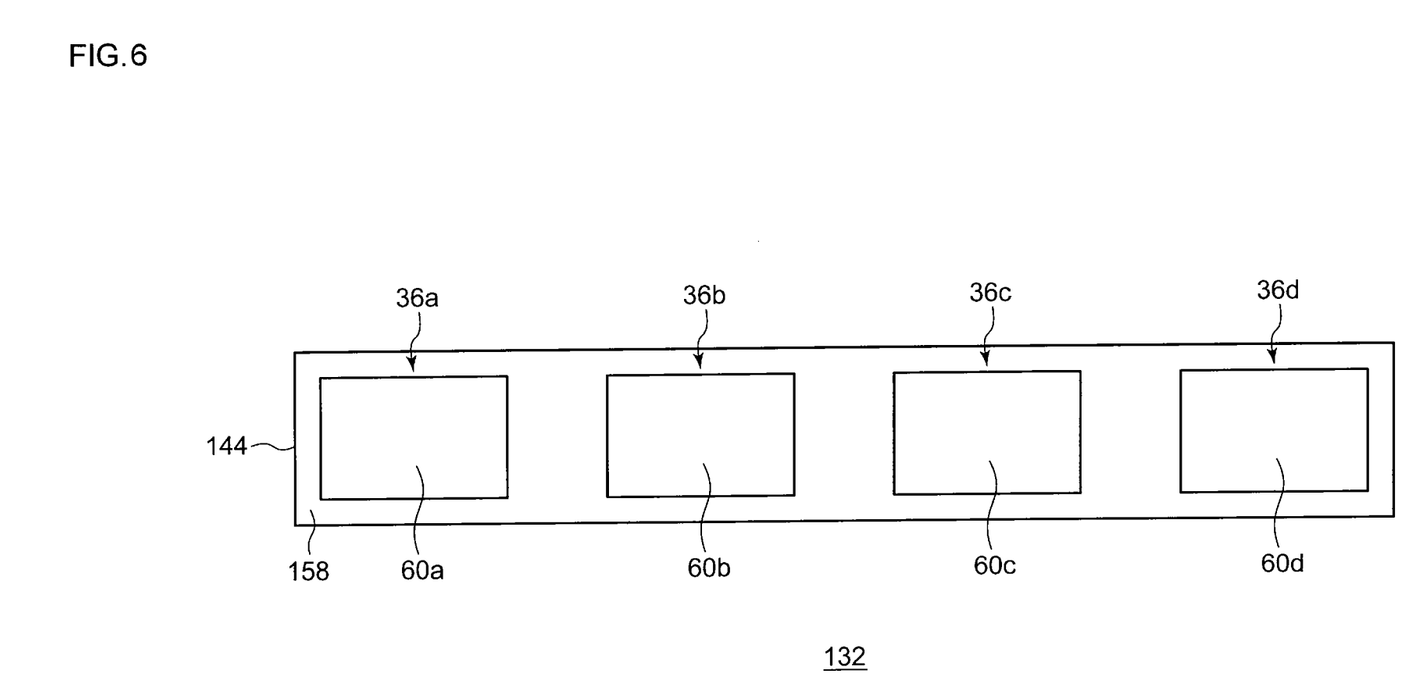
FIG. 6 is a view of a variation of the light emitting module according to the present embodiment, when viewed from the light emission side.

FIG. 5 is a view of the light emitting module 32 according to the present embodiment, when viewed from the light emission side. As illustrated in FIG. 5, the phosphor layer 44 is divided into a plurality of areas 60a, 60b, 60c, and 60d by the shielding portions 58b, 58c, and 58d. As a method of manufacturing the phosphor layer 44, a method can be adopted in which the plurality of shielding portions and the respective areas of which the phosphor layer is composed are formed integrally with each other. However, the phosphor layer 44 may be formed by, for example, producing a plurality of components in which each area of which the phosphor layer is composed and each shielding portion are combined and then by mounting the plurality of components on the semiconductor light emitting elements that have been arranged on the substrate 34. FIG. 6 is a view of a variation of the light emitting module according to the present embodiment, when viewed from the light emission side. In a phosphor layer 144 in a light emitting module 132, the respective areas 60a to 60d of which the light wavelength conversion component is composed are provided inside a shielding portion 158 integrated with the phosphor layer 144.

Materials used for the light wavelength conversion component include a rein composition, a glass composition, in all of which powdered phosphor is dispersed, and later-described fluorescent ceramic. In particular, fluorescent ceramic, an inorganic material, can be molded into various shapes and be machined with high accuracy. Accordingly, the fluorescent ceramic is particularly suitable for being used as a plate-shaped light wavelength conversion component. The aforementioned LED element is preferred as the semiconductor light emitting element; however, the illumination wavelength of the semiconductor light emitting element may be within the range of not only visible light but also ultraviolet.

Figure 7:
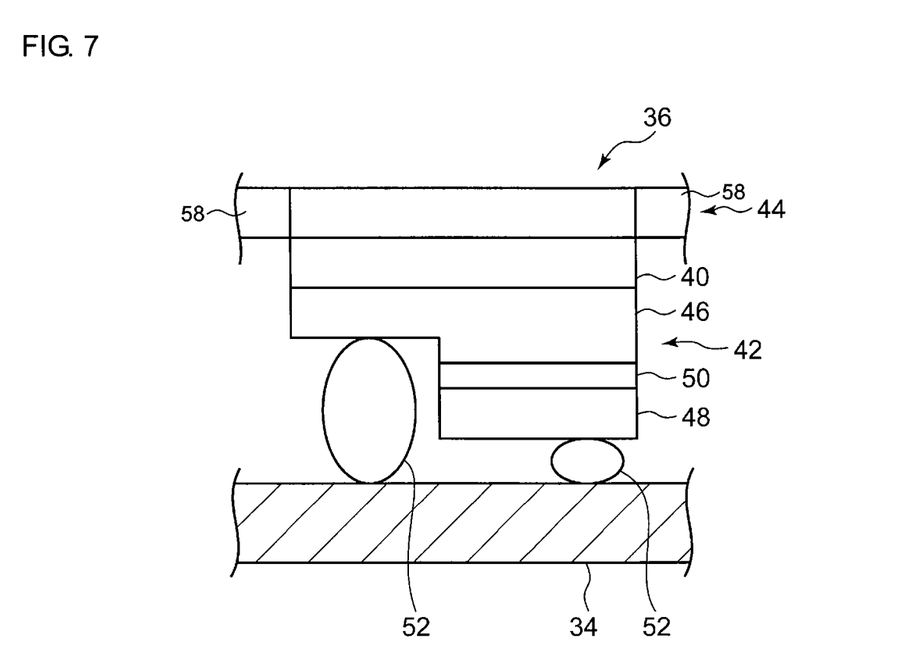
FIG. 7 is a cross-sectional view illustrating an example of a light emitting unit suitable for the present embodiment.

Subsequently, the light emitting unit 36 comprising a semiconductor light emitting element 42 will be described in further details. FIG. 7 is a cross-sectional view illustrating an example of a light emitting unit suitable for the present embodiment. The light emitting unit comprises a growth substrate 40, a semiconductor light emitting element 42 grown on the growth substrate, and the phosphor layer 44. The light emitting unit 36 is supported by the substrate 34. A material for the substrate 34 is appropriately selected from the group of, for example, glass epoxy resin, polyimide resin, stainless steel such as SUS, Cu, AlN, SiC, and Si, etc. The growth substrate 40 is composed of a crystal with a lattice constant suitable for producing the semiconductor light emitting element 42, and it is preferable that the growth substrate has translucency. In the light emitting unit 36 according to the present embodiment, sapphire is used as the growth substrate 40.

In the light emitting unit 36 illustrated in FIG. 7, the plate-shaped phosphor layer 44 is provided so as to face the light emitting surface of the semiconductor light emitting element 42 with the growth substrate 40 being sandwiched by the two. The semiconductor light emitting element 42 is composed of an LED element. In the present embodiment, a blue LED mainly emitting light with a blue wavelength is adopted as the semiconductor light emitting element 42. Specifically, the semiconductor light emitting element 42 has an n-type semiconductor layer 46 crystal-grown on a sapphire growth substrate 40, a p-type semiconductor layer 48, and a light emitting layer 50 formed between the two. Because the semiconductor light emitting element 42 emits light mainly in the light emitting layer 50, the upper surface of the light emitting layer 50 can be regarded as the light emitting surface. The semiconductor light emitting element 42 is flip-chip mounted on the substrate 34 via a bump 52. It is needless to say that the structure of the semiconductor light emitting element 42 and the wavelength of the light emitted thereby should not be limited to those stated above.

The phosphor layer 44 is a light wavelength conversion component and is composed of at least light wavelength conversion ceramic. The light wavelength conversion ceramic is produced by machining a plate-shaped molded article having a thickness of 1 μm or more and less than 5000 μm, preferably 10 μm or more and less than 1000 μm, in accordance with the size of the semiconductor light emitting element 42. It is needless to say that the size of the light wavelength conversion ceramic should not be limited thereto. In the phosphor layer 44 according to the present embodiment, a shielding portion 58 is formed in the boundary between respective areas facing the respective light emitting surfaces of the adjacent semiconductor light emitting elements.

The light wavelength conversion ceramic is what is so called light emitting ceramic or fluorescent ceramic, and can be obtained by sintering a ceramic base material, which has been made by using YAG (Yttrium Alminium Garnet) powder, a phosphor excited by blue light. Because a method of manufacturing such light wavelength conversion ceramic is known, detailed description with respect thereto will be omitted. In the light wavelength conversion ceramic thus obtained, dispersion of light on the surface of the powder can be suppressed, different from, for example, a powdered phosphor, thereby making a loss of the light emitted by the light emitting element 42 very small.

When the YAG powder is used as a phosphor, it is preferable that the substance injected into the shielding portion 58 has a refractive index smaller than or equal to 1.8. With such a substance, part of the light emitted by the semiconductor light emitting element 42 is shielded by the shielding portion 58, or total reflection occurs in some cases, thereby it can be suppressed that the light may be absorbed in vain.

The light wavelength conversion ceramic converts the wavelength of the blue light mainly emitted by the semiconductor light emitting element 42 to emit yellow light. Accordingly, synthesized light that has been synthesized from the blue light, which has been transmitted through the phosphor layer 44 as it is, and the yellow light whose wavelength has been converted by the light wavelength conversion ceramic, is emitted from the light emitting unit 36. Thus, the light emitting unit 36 can emit white light.

As the semiconductor light emitting element 42, a semiconductor light emitting element mainly emitting light having a wavelength other than blue may be adopted. Also, in this case, light wavelength conversion ceramic for converting the wavelength of the light manly emitted by the semiconductor light emitting element 42 is adopted. Also, in this case, the light wavelength conversion ceramic may convert the wavelength of the light emitted by the semiconductor light emitting element 42 such that light having a wavelength of white or close to white is produced by combining with the light having the wavelength mainly emitted by the semiconductor light emitting element 42.

Second Embodiment

Figure 8:
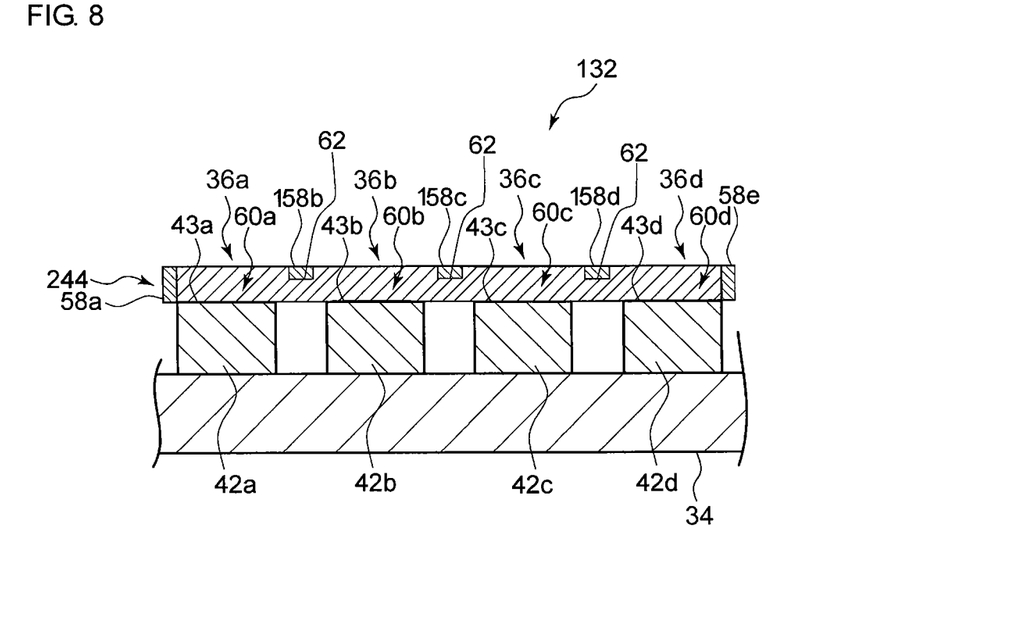
FIG. 8 is a cross-sectional view illustrating the major portion of a light emitting module according to a second embodiment.

FIG. 8 is a cross-sectional view illustrating the major portion of a light emitting module according to a second embodiment. The description with respect to the same structures as in the first embodiment will be appropriately omitted. In a light emitting module 132 according to the present embodiment, a plurality of grooves 62 are formed on the surface on the light emission side of a phosphor layer 244. Thereby, even after a plurality of semiconductor light emitting elements 42a to 42d have been fixed to the phosphor layer 244, the light emitting module 132 can be easily machined from the light emission side to which a semiconductor light emitting element is not fixed. A shielding material for preventing light from transmitting therethrough is injected into each groove 62 in the same way as the material described in the first embodiment, so that shielding portions 158b, 158c, and 158d are structured. Thereby, the shielding portions 158b, 158c, and 158d can be formed while the light wavelength conversion component is being integrated as one piece without being cut into a plurality of pieces.

Figure 9:
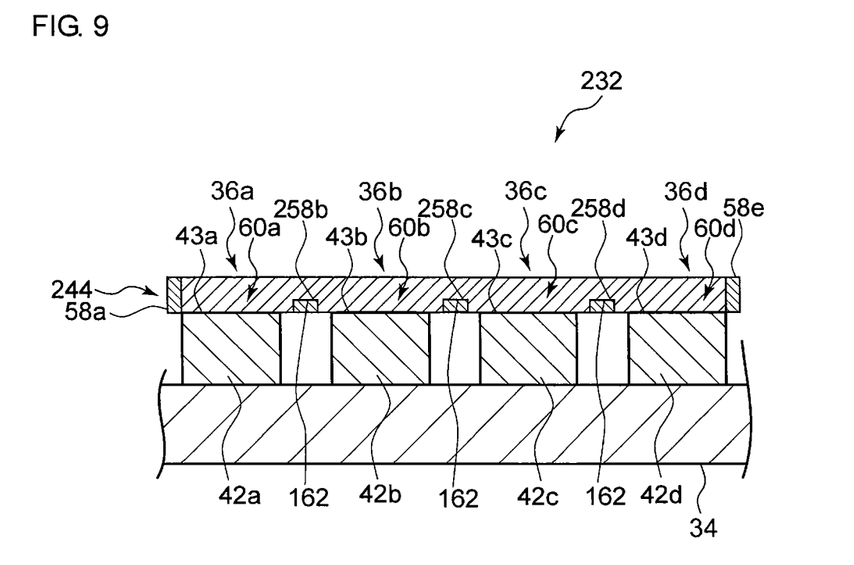
FIG. 9 is a cross-sectional view illustrating the major portion of a light emitting module according to a variation of the second embodiment.

FIG. 9 is a cross-sectional view illustrating the major portion of a light emitting module according to a variation of the second embodiment. In a light emitting module 232, a plurality of grooves 162 are formed on the surface of the phosphor layer 244, the surface facing a semiconductor element. Thereby, shielding portions 258b, 258c, and 258d are structured in the respective grooves 162 by injecting a shielding material for preventing light from transmitting therethrough into the grooves 162 in the same way as the material described in the first embodiment. Thereby, the shielding portions 258b, 258c, and 258d can be formed while the light wavelength conversion component is being integrated as one piece without being cut into a plurality of pieces.

Figure 10:
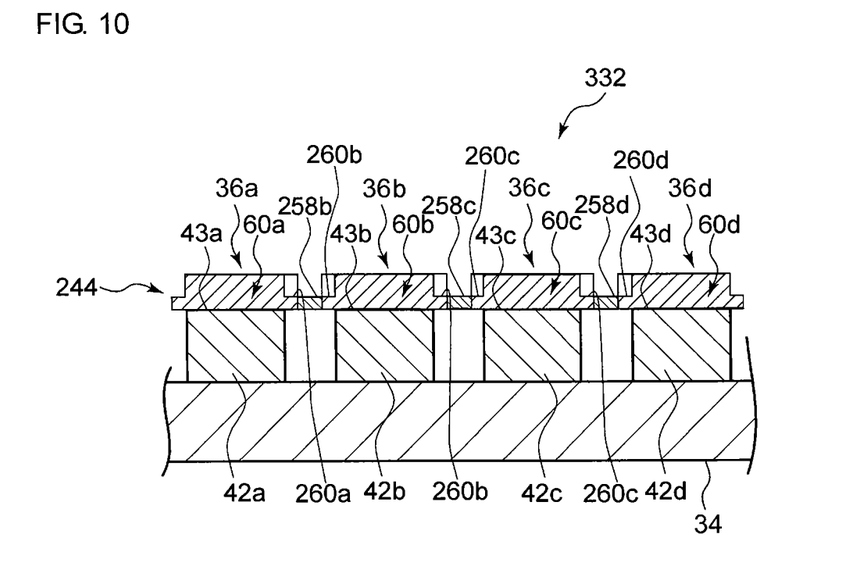
FIG. 10 is a cross-sectional view illustrating the major portion of a light emitting module according to a variation of the second embodiment.

FIG. 10 is a cross-sectional view illustrating the major portion of a light emitting module according to a variation of the second embodiment. In a light emitting module 332, thin-walled portions 260a to 260d are formed in part of the phosphor layer 244. Of the phosphor layer 244, the thin-walled portions 260a and 260b are formed in places located upward of the gap between the semiconductor light emitting elements 42a and 42b to be adjacent to the shielding portion 258b. Of the phosphor layer 244, the thin-walled portions 260b and 260c are formed in places located upward of the gap between the semiconductor light emitting elements 42b and 42c to be adjacent to the shielding portion 258c. Of the phosphor layer 244, the thin-walled portions 260c and 260d are formed in places located upward of the gap between the semiconductor light emitting elements 42c and 42d to be adjacent to the shielding portion 258d.

As stated above, in the light emitting module 332, the thin-walled portions 260a to 260d are formed in the respective boundary areas between the respective light emitting units 36a to 36d, of the phosphor layer 244. That is, of the phosphor layer 244, the portions not facing the semiconductor light emitting element 42 are made to be thin in wall thickness. Thereby, color non-uniformity can be prevented.

Third Embodiment

Figure 11:
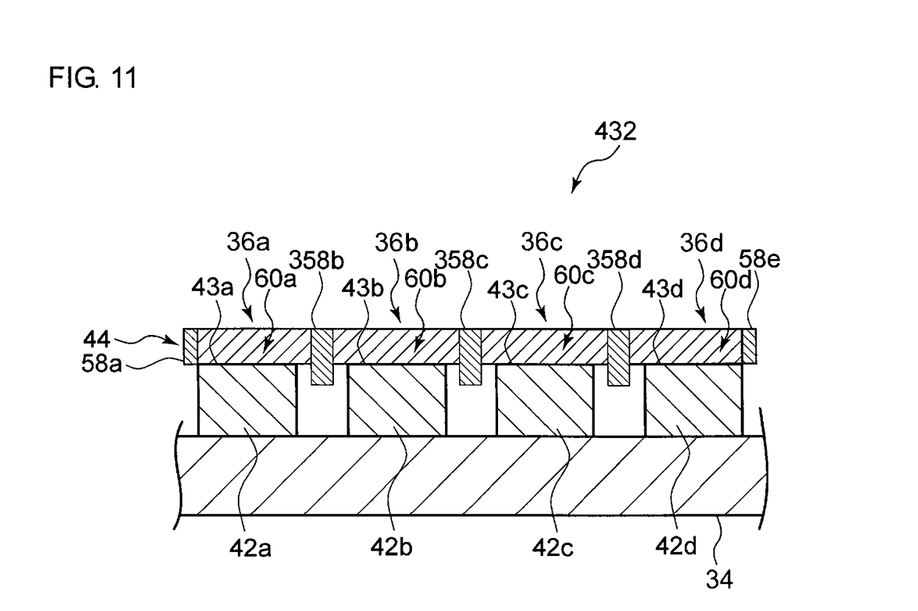
FIG. 11 is a cross-sectional view illustrating the major portion of a light emitting module according to a third embodiment and FIG. 12 is a functional block view illustrating the structures of an illumination controller of the automotive headlamp apparatus and a vehicle controller of the vehicle.

FIG. 11 is a cross-sectional view illustrating the major portion of a light emitting module according to a third embodiment. The description with respect to the same structures as in each aforementioned embodiment will be appropriately omitted. In a light emitting module 432, shielding portions 358b to 358d are formed in part of the phosphor layer 244. The shielding portion 358b is formed in the boundary between the respective areas 60a and 60b respectively facing the light emitting surfaces 43a and 43b of the adjacent semiconductor light emitting elements 42a and 42b. The shielding portion 358c is formed in the boundary between the respective areas 60b and 60c respectively facing the light emitting surfaces 43b and 43c of the adjacent semiconductor light emitting elements 42b and 42c. The shielding portion 358d is formed in the boundary between the respective areas 60c and 60d respectively facing the light emitting surfaces 43c and 43d of the adjacent semiconductor light emitting elements 42c and 42d.

The shielding portions 358b to 358d are formed to protrude toward the gaps between the respective semiconductor light emitting elements 42a to 42d from the lower surface of the phosphor layer 44. Thereby, it can be suppressed that the light emitted from each semiconductor light emitting element 42 may enter the phosphor layer in the next light emitting unit 36. When the space between the phosphor layer 44 and the semiconductor light emitting element 42 is large, it is good to provide the shielding portions 358b to 358d such that the lower ends thereof are located at least below the light emitting surfaces 43a to 43d of each semiconductor light emitting element 42.

(Automotive Lamp)

Figure 12:
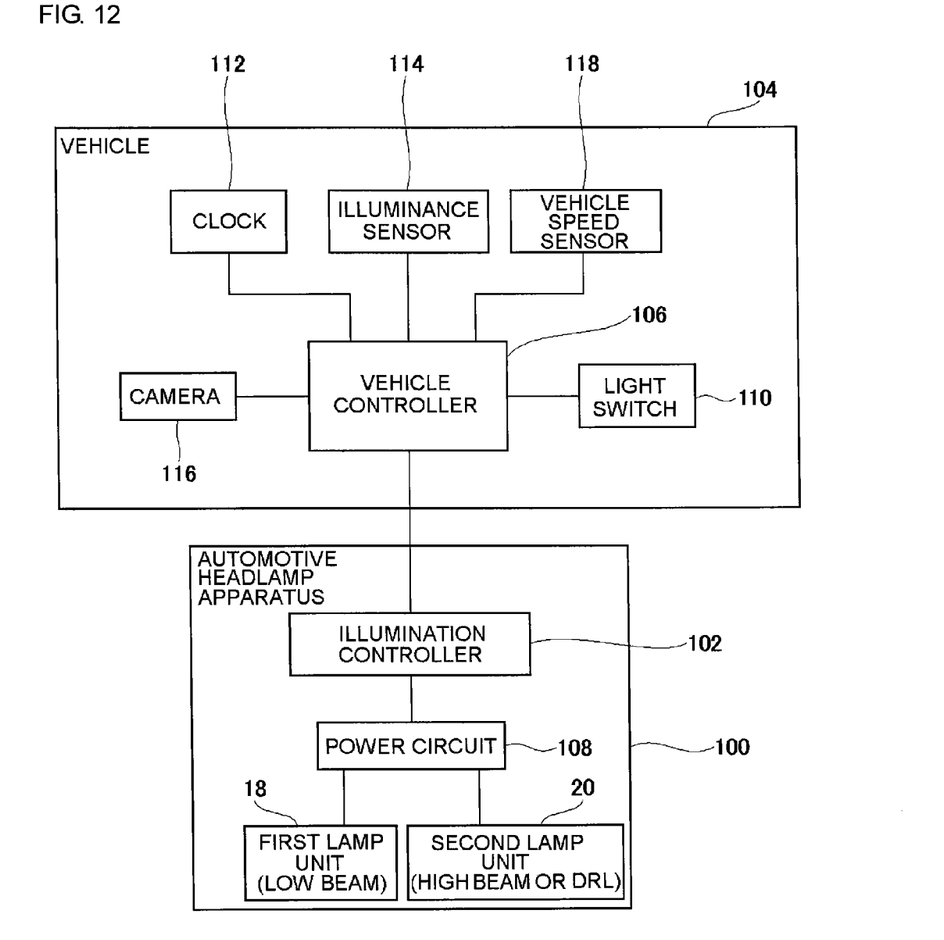

FIG. 12 is a functional block view illustrating the structures of an illumination controller of the automotive headlamp apparatus configured as stated above and a vehicle controller of the vehicle. An illumination controller 102 of an automotive headlamp apparatus 100 controls a power circuit 108 in accordance with an order of a vehicle controller 106 mounted on a vehicle 104 to control illumination of the first lamp unit 18 and the second lamp unit 20.

A light switch 110, a clock 112, an illuminance sensor 114, a camera 116, and a vehicle speed sensor 118 are connected to the vehicle controller 106. The light switch 110 is a switch for manually performing: switching of low beam illumination by turning on/off the first lamp unit 18; switching of high beam illumination by turning on/off the second lamp unit 20 while the lamp unit 18 is being turned on; and switching of DRL illumination by turning on/off the second lamp unit 20 while the first lamp unit 18 is being turned off.

Even when the light switch 110 is not operated, the automotive headlamp apparatus 100 according to the present embodiment can control the turn-on/off of the first lamp unit 18 and the second lamp unit 20 by detecting the situations around the vehicle 104. For example, the clock 112 provides present day and time or present season and time to the vehicle controller 106. When it can be determined based on the day and time or the season that the surroundings of the vehicle 104 is so dark that the automotive head lamp 100 is needed to be turned on, the vehicle controller 106 may send the illumination controller 102 a command for turning on the first lamp unit 18 to automatically emit low beam light. On the other hand, when the vehicle controller 106 determines that the surroundings of the vehicle are so bright that the automotive headlamp apparatus 100 is not needed to be turned on, the vehicle controller 106 may send the illumination controller 102 a command for reducing the illumination of the second lamp unit 20 to automatically emit DRL light. Further, when it is determined based on the information from the camera 116 that a forward vehicle or a pedestrian is not present in front of the vehicle, the vehicle controller 106 may automatically switch from low beam illumination to high beam illumination.

As stated above, in the present embodiment, when an object to which illumination should be suppressed is present within the high beam illumination area while the first and the second lamp units 18 and 20 are being turned on, the second lamp unit 20 is controlled such that the partial area in the illumination area of the second lamp unit 20, corresponding to the position where the object is present, is not illuminated. Herein, the object to which illumination should be suppressed is an oncoming vehicle, a leading vehicle, or a pedestrian, etc. In order to perform such turn-off control, the vehicle controller 106 uses image data provided by the camera 116 as a means for recognizing an object, for example, a stereo camera, etc. The photographing range of the camera 116 matches the range of the virtual vertical screen. When an image containing a feature point indicating a vehicle or a pedestrian, which has been held beforehand, is present in the photographed image, it is determined that an object to which illumination should be suppressed is present within the high beam illumination area. Thereafter, the vehicle controller 106 supplies information to the illumination controller 102 such that the light emitting unit 36 by which the partial area, corresponding to the position where an object to which illumination should be suppressed is present, is formed, will be turned off. A means for detecting, within the high beam illumination area, a target to which illumination should be suppressed can be appropriately changed and other detection means, such as a millimeter-wave radar and an infrared radar, may be adopted instead of the camera 116. Such detection means may be used in combination. Alternatively, switching of an illumination mode for high beam and that for daytime lighting may be controlled by detecting the brightness of the surroundings of the vehicle 104 based on the information from the camera 116.

In the present embodiment, the automotive headlamp apparatus as an automotive lamp is provided with a control circuit by which dimming of the plurality of light emitting units included in the light emitting module is individually controlled. When the plurality of light emitting units included in the light emitting module are divided into multiple groups, the control circuit may control the dimming for each group. Such an automotive headlamp apparatus can achieve a desired light distribution characteristic with high accuracy by comprising the aforementioned light emitting module.

The present invention has been described above based on the preferred embodiments. The embodiment has been given solely by way of illustration, and it will be understood by a person skilled in the art that various modifications may be made to combinations of the foregoing components and processes, and all such modifications are also intended to fall within the scope of the present invention.

Although the description has been made with respect to a light emitting unit in which a semiconductor light emitting element emitting blue light and a yellow phosphor are combined in the aforementioned embodiments, another light emitting unit may be adopted in which a semiconductor light emitting element emitting ultraviolet light and a plurality of phosphors respectively emitting red, green, and blue light by being excited with the ultraviolet light, are provided. Alternatively, a light emitting unit provided with a semiconductor light emitting element emitting ultraviolet light and phosphors respectively emitting blue and yellow light by being excited with the ultraviolet light, may be adopted.

In the aforementioned embodiments, a ceramic material is used as a light wavelength conversion component; however, a component that is made by mixing silicone resin, glass, and sol-gel agent with powdered phosphor to be machined into a plate-shape, may be adopted as a light wavelength conversion component. A phosphor layer having 40% or more of the light transmission rate at a wavelength of 600 nm is preferred. The light emitting module according to the present embodiment can be adopted in not only automotive lamps but also lamps for lighting.

What is claimed is:

1. A light emitting module comprising:
    a plurality of semiconductor light emitting elements;
    a substrate by which the arranged plurality of semiconductor light emitting elements are supported; and
    a plate-shaped fluorescent ceramic that is provided so as to face the light emitting surfaces of the plurality of semiconductor light emitting elements and that converts the wavelength of the light emitted by the semiconductor light emitting element,
    wherein the fluorescent ceramic has a shielding portion formed in the boundary between respective areas facing the respective light emitting surfaces of the adjacent semiconductor light emitting elements, and
    wherein the shielding portion is provided at a position above a gap between two adjacent semiconductor light emitting elements and is spaced apart from the substrate.

2. The light emitting module according to claim 1, wherein the shielding portion is structured by injecting a shielding material for preventing light from transmitting therethrough into a groove formed in the fluorescent ceramic.

3. The light emitting module according to claim 2, wherein the groove is formed on the surface on the light emission side of the fluorescent ceramic.

4. The light emitting module according to claim 1, wherein each of the plurality of the semiconductor light emitting elements is structured such that dimming thereof can be individually performed.

5. The light emitting module according to claim 2, wherein each of the plurality of the semiconductor light emitting elements is structured such that dimming thereof can be individually performed.

6. The light emitting module according to claim 3, wherein each of the plurality of the semiconductor light emitting elements is structured such that dimming thereof can be individually performed.

7. An automotive lamp comprising:
    the light emitting module of claim 1; and
    a control circuit by which, when the plurality of the light emitting elements included in the light emitting module are divided into multiple groups, dimming is controlled for each group.

* * * * *